(12) United States Patent
Sakurai

(10) Patent No.: US 8,828,877 B2
(45) Date of Patent: Sep. 9, 2014

(54) ETCHING SOLUTION AND TRENCH ISOLATION STRUCTURE-FORMATION PROCESS EMPLOYING THE SAME

(75) Inventor: Issei Sakurai, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 167 days.

(21) Appl. No.: 13/320,833

(22) PCT Filed: May 24, 2010

(86) PCT No.: PCT/JP2010/058711
§ 371 (c)(1),
(2), (4) Date: Nov. 16, 2011

(87) PCT Pub. No.: WO2010/137544
PCT Pub. Date: Dec. 2, 2010

(65) Prior Publication Data
US 2012/0064722 A1    Mar. 15, 2012

(30) Foreign Application Priority Data

May 25, 2009  (JP) .................................. 2009-125539
Nov. 9, 2009  (JP) .................................. 2009-255960

(51) Int. Cl.
*H01L 21/311*    (2006.01)
*H01L 21/762*    (2006.01)
*H01L 21/02*     (2006.01)

(52) U.S. Cl.
CPC .... *H01L 21/31111* (2013.01); *H01L 21/76229* (2013.01); *H01L 21/02222* (2013.01); *H01L 21/02164* (2013.01); *H01L 21/02326* (2013.01)

USPC ............................ 438/700; 438/689; 438/745

(58) Field of Classification Search
None
See application file for complete search history.

(56) References Cited

U.S. PATENT DOCUMENTS

| | | | |
|---|---|---|---|
| 6,781,148 B2 * | 8/2004 | Kubota et al. | ................... 257/40 |
| 7,404,910 B1 | 7/2008 | Kezuka et al. | |
| 2006/0011584 A1 * | 1/2006 | Itano et al. | ...................... 216/83 |
| 2007/0145009 A1 | 6/2007 | Fucsko et al. | |

FOREIGN PATENT DOCUMENTS

| | | |
|---|---|---|
| JP | 11-297656 A | 10/1999 |
| JP | 2000-164586 A | 6/2000 |
| JP | 4221601 B2 | 11/2008 |
| JP | 2009-94321 A | 4/2009 |
| WO | WO 2006/126583 A1 | 11/2006 |

OTHER PUBLICATIONS

Machine Language English Abstract from Espacenet of WO 2006/0126583 A1.

* cited by examiner

*Primary Examiner* — Leonard Chang
(74) *Attorney, Agent, or Firm* — Sangya Jain

(57) ABSTRACT

The present invention provides an etching solution less affected by trench structures and also provides an isolation structure-formation process employing the solution. The etching solution contains hydrofluoric acid and an organic solvent. The organic solvent has a δH value defined by Hansen solubility parameters in the range of 4 to 12 inclusive and the saturation solubility thereof in water is 5 wt % or more at 20° C. This solution can be adopted instead of known etching solutions used in conventional production processes of semiconductor elements.

13 Claims, 3 Drawing Sheets

ETCHING SOLUTION AND TRENCH ISOLATION STRUCTURE-FORMATION PROCESS EMPLOYING THE SAME

This application is a United States National Stage Patent Application under 35 U.S.C. §371 of International Patent Application No. PCT/JP2010/058711, filed May 24, 2010, which claims priority to Japanese Patent Applications No. 2009-125539, filed May 25, 2009, and No. 2009-255960, filed Nov. 9, 2009, the contents of both documents being hereby incorporated herein by reference.

TECHNICAL FIELD

The present invention relates to an etching solution by use of which spin-on dielectric layers (hereinafter, referred to as "SOD layers") serving as insulating layers are etched in production processes of semiconductor elements.

BACKGROUND ART

In an electronic device such as a semiconductor element, semiconductor parts such as transistor, resistor and the like are arranged on a substrate. Since those parts must be electrically insulated from each other, it is necessary to form an area separating them. This area is referred to as an "isolation area". Hitherto, the isolation area has been generally provided by forming an insulating layer selectively on the surface of the semiconductor substrate.

Meanwhile, recently in the field of electronic device technology, the density and the integration degree have been more and more increased. According as the density and the integration degree are becoming higher, it is getting more difficult to form an isolation structure having fineness corresponding to the required integration degree. It is, therefore, desired to provide a new isolation structure satisfying the required fineness. As one of the isolation structures capable of satisfying the requirement, a trench isolation structure is proposed. The trench isolation structure is fabricated by forming fine trenches on a semiconductor substrate and then filling the trenches with insulating material so as to electrically separate the part positioned on one side from that on the other side of each trench. The structure thus electrically separating the parts can reduce the isolation area, as compared with the conventional structure, and accordingly, is effective in achieving the integration degree required in these days.

The trench isolation structure can be formed, for example, according to a self-aligned shallow trench isolation process. This process normally comprises the steps of: coating a composition containing insulating material (hereinafter, referred to as "SOD material") onto the substrate surface beforehand provided with trenches, so as to fill the trenches with the composition; hardening the SOD material by firing or the like, so as to convert the SOD material to form an insulating layer; removing excess of the layer on the substrate surface by chemical mechanical polishing (hereinafter, referred to as "CMP"); and flattening the substrate surface by wet-etching.

For the above process, various etching solutions have been studied. The simplest solutions are, for example, an aqueous hydrofluoric acid solution and a hydrofluoric acid buffer. Further, other examples of the solutions include an isopropyl alcohol-added aqueous hydrofluoric acid solution (disclosed in Patent document 1) and a solution of hydrofluoric acid salt dissolved in organic solvent (disclosed in Patent document 2).

PRIOR ART DOCUMENTS

Patent Documents

[Patent document 1] U.S. Patent Publication No. 2007/0145009

[Patent document 2] International Patent Publication No. 2006/126583

DISCLOSURE OF INVENTION

Problem to be Solved by the Invention

The present inventors have found that there is room for improvement on the conventional process described above. That is, the etching rate in the wet-etching procedure may be uneven depending on the trench isolation structure. For example, in a narrow trench, the etching rate of the periphery is often relatively so large that the material at the center is left more than that at the periphery to form a ridge. The material in a wide trench is also often so unevenly removed to form ridges and furrows in the trench. Those defects of the structure are unfavorable in view of insulation failure and mechanical strength, and hence there is need for improvement.

Means for Solving Problem

The present invention resides in an etching solution containing hydrofluoric acid and an organic solvent, wherein said organic solvent has a δH value defined by Hansen solubility parameters in the range of 4 to 12 inclusive and the saturation solubility thereof in water is 5 wt % or more at 20° C.

The present invention also resides in a process for forming a shallow trench isolation structure, comprising the steps of:

coating a composition containing insulating material onto a substrate surface provided with a trench structure, to form a coating layer;

firing the coated substrate to harden the insulating material, so as to form an insulating layer; and subjecting the insulating layer after polished to etching treatment by use of an etching solution containing hydrofluoric acid and an organic solvent, wherein said organic solvent has a δH value defined by Hansen solubility parameters in the range of 4 to 12 inclusive and the saturation solubility thereof in water is 5 wt % or more at 20° C.

Effect of the Invention

In a semiconductor element production process, particularly, in a shallow trench isolation structure-formation process, trenches of various widths on a substrate are filled with insulating material to form an insulating layer. The present invention provides an etching solution that makes it possible to etch equally all the trenches and evenly the material in each trench. Consequently, the etching solution enables to form a shallow trench isolation structure having fewer defects and excellent properties in insulation and mechanical strength.

BEST MODE FOR CARRYING OUT THE INVENTION

Embodiments of the present invention are described below in detail.

Figure 1:
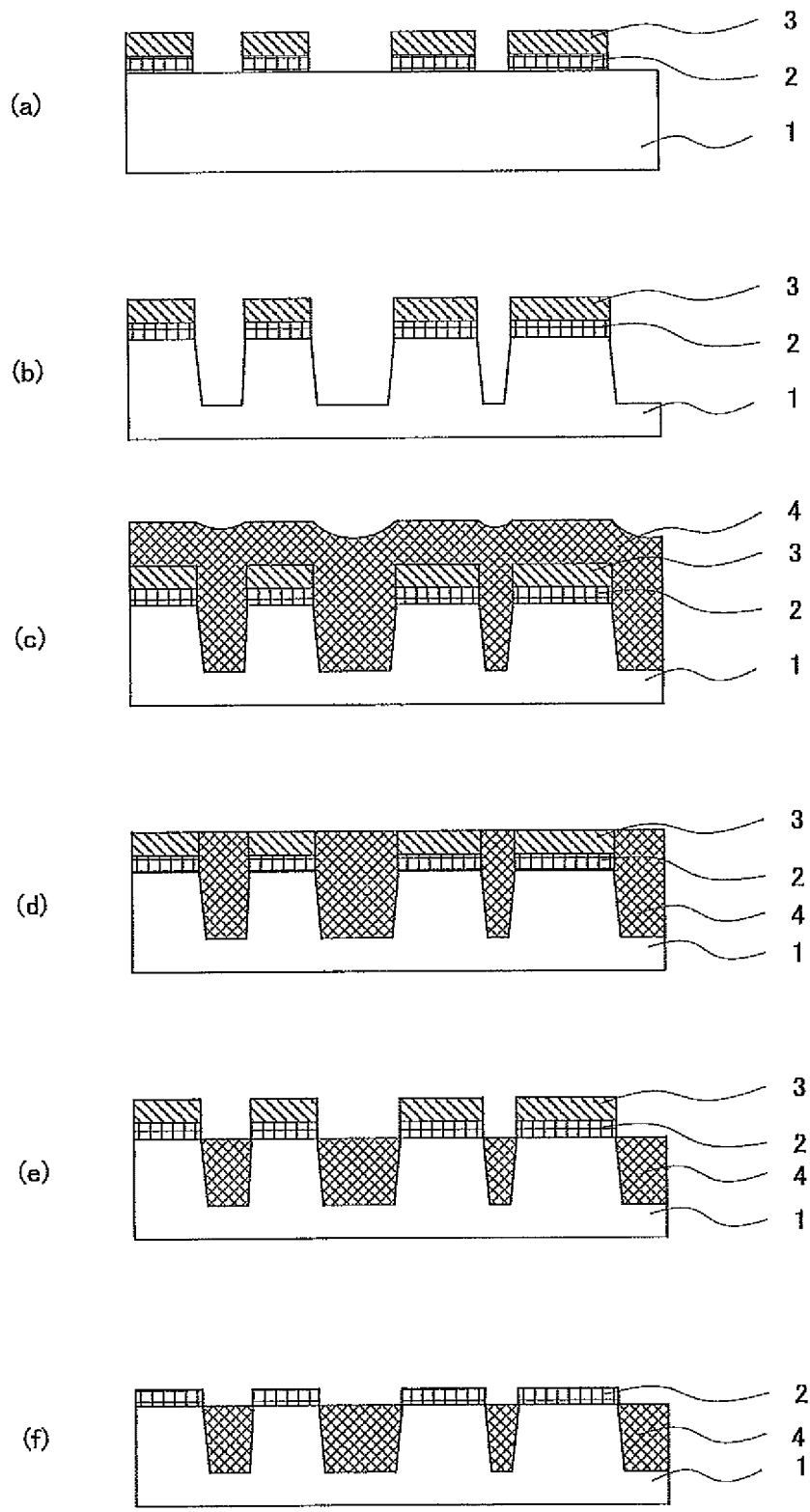
FIG. 1 shows schematic sectional views illustrating a shallow trench isolation structure-formation process employing the etching solution of the present invention.

A self-aligned shallow trench isolation process employing the etching solution of the present invention will be explained with reference to FIG. 1 in the following description.

First, a circuit 2 or the like is formed on a substrate 1 by use of a metal thin film. The substrate can be made of any material selected from semiconductor materials such as silicon or other materials. The circuit or the like can be formed on the substrate by any method, such as etching or printing. According to the necessity, a cap 3 is formed on the circuit or the like (FIG. 1(a)). The cap 3 has function of protecting the circuit or the like in the etching procedure performed later, and can be formed by use of, for example, photoresist. The cap 3 is not necessarily formed after the circuit or the like is formed. Specifically, for example, after an even metal film is formed on the substrate surface, the cap 3 is formed thereon by use of photoresist and then the metal film is etched through the cap 3 serving as a mask to form the circuit 2.

Subsequently, the substrate 1 is subjected to etching by use of the cap 3 as a mask, so that the aimed pattern is transferred onto the substrate 1 to form a trench isolation structure (FIG. 1(b)).

When a trench isolation structure is formed by use of the etching solution according to the present invention, there is no particular restriction on the width and depth of the trenches. However, the width is generally 0.02 to 10 μm, preferably 0.02 to 5 μm, and the depth is generally 200 to 1000 nm, preferably 300 to 700 nm.

According to, for example, CVD method or ALD (atomic layer deposition) method, it is also possible to form further a silicon nitride liner layer, a polysilicon layer, a silicon oxide layer or the like on the substrate surface provided with trenches.

Thereafter, the substrate surface provided with trenches is coated with a composition containing SOD material, from which a SOD layer is to be made, so that the trenches are filled with the SOD material. The SOD material is preferably selected from the group consisting of polysilazane, hydrogenated silsesquioxane and mixture thereof, and is more preferably polysilazane.

There is no particular restriction on the polysilazane, and any polysilazane can be used unless it impairs the effect of the present invention. The polysilazane may be either an inorganic compound or an organic one. It is most preferred for the polysilazane to comprise the following units (Ia) to (Ic) in combination:

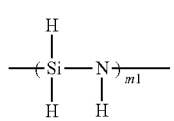

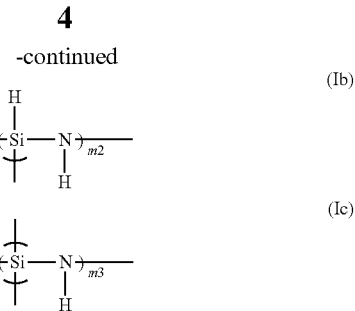

in which m1 to m3 are numbers indicating the polymerization degrees.

Further, it is particularly preferred for the above polysilazane to have a weight average molecular weight of 700 to 30000 in terms of styrene.

It is also possible to adopt a polysilazane having a number average molecular weight of about 100 to 50000 and having a skeleton comprising the following unit (II):

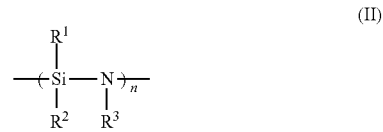

in which n is a number indicating the polymerization degree; and each of $R^1$, $R^2$ and $R^3$ is independently a hydrogen atom, an alkyl group, an alkenyl group, a cycloalkyl group, an aryl group, an alkylsilyl group, an alkylamino group, an alkoxy group or another group, such as a fluoroalkyl group, having a carbon atom directly connecting to a silicon atom, provided that at least one of $R^1$, $R^2$ and $R^3$ is a hydrogen atom. This polysilazane may be modified to use. Two or more polysilazane compounds may be used in combination.

The SOD material-containing composition used in the present invention contains a solvent capable of dissolving the above SOD material. There is no particular restriction on the solvent as long as it can dissolve the components of the composition. Preferred examples of the solvent include:

(a) aromatic compounds: such as benzene, toluene, xylene, ethylbenzene, diethylbenzene, trimethylbenzene, and triethylbenzene; (b) saturated hydrocarbons: such as n-pentane, i-pentane, n-hexane, i-hexane, n-heptane, i-heptane, n-octane, i-octane, n-nonane, i-nonane, n-decane, and i-decane; (c) alicyclic hydrocarbons: such as ethylcyclohexane, methylcyclohexane, cyclohexane, cyclohexane, p-menthane, decahydronaphthalene, dipentene, and limonene; (d) ethers: such as dipropyl ether, dibutyl ether, diethyl ether, methyl tert-butyl ether (hereinafter, referred to as MTBE), and anisole; and (e) ketones: such as methyl i-butyl ketone (hereinafter, referred to as MIBK). Among them, more preferred are (b) saturated hydrocarbons, (c) alicyclic hydrocarbons, (d) ethers and (e) ketones.

Two or more of those solvents may be properly mixed for the purposes of controlling the evaporation speed, of reducing the harm to the human body, and of adjusting the solubility of each component.

If necessary, the SOD material-containing composition may further contain optional additives. Examples of the additives include: a crosslinking accelerator, which promotes crosslinking reaction of the SOD material such as polysilazane; a catalyst for conversion reaction of the SOD material into insulator; and a viscosity modifier for controlling viscosity of the composition. Further, when used for a semiconductor devise, the composition can contain a phosphorus compound such as tris(trimethylsilyl)phosphate for the sake of Na-gettering effect.

The amount of each component described above depends on the conditions of coating, firing and so on. The content of the SOD material is preferably 1 to 30 wt %, more preferably 2 to 20 wt % based on the total weight of the composition. However, this by no means restricts the concentration of the SOD material, and the composition can contain the SOD material in any amount as long as it can give a trench isolation structure defined by the present invention. The additives other than the SOD material are contained in various contents, but the amount of each additive is preferably 0.001 to 40 wt %, more preferably 0.005 to 30 wt %, most preferably 0.01 to 20 wt % based on the weight of the SOD material.

The aforementioned composition can be coated on the substrate according to known methods, such as spin coating, curtain coating, and dip coating. Among them, spin coating is particularly preferred because of surface evenness of the coating layer to be formed. The coating layer, namely, the layer formed by coating on the substrate, has a thickness of preferably 20 to 150 nm, more preferably 30 to 100 nm in the area where the trenches are not provided.

The substrate coated with the composition can be prebaked. The prebaking step is carried out for the purpose of at least partly removing the solvent in the coating layer.

In order to remove the solvent, the substrate is normally heated at an essentially constant temperature. The solvent should be removed under the condition that the SOD material does not undergo oxidation or polymerization reaction. Accordingly, the solvent is removed at a temperature of normally 50 to 250° C., preferably 80 to 200° C., for generally 0.5 to 10 minutes, preferably 1 to 5 minutes.

After the SOD material-containing composition is coated and then, if necessary, the solvent thereof is removed, the whole coating layer is fired and thereby converted into an insulating layer 4 (FIG. 1(c)). The firing is preferably performed in a hardening furnace or on a hot-plate under a steam-containing inert gas or steam-containing oxygen atmosphere. In this procedure, steam is important for fully converting the SOD material to form an insulating layer. The concentration of steam is preferably 1% or more, further preferably 10% or more, particularly preferably 20% or more. If the concentration of steam is 20% or more, the SOD material is readily converted into insulator and defects such as voids are less formed, so that the resulting insulating layer has improved characteristics. When an inert gas is used for the atmosphere, gases such as nitrogen, argon and helium can be adopted.

The temperature condition for hardening depends on the kind of the SOD material and on the combination of the production steps. At a relatively high temperature, the SOD material tends to be converted rapidly to form an insulating layer. On the other hand, however, if the SOD material is hardened at a low temperature, the resultant device tends to have characteristics less suffering from unfavorable effects given by oxidation or crystal structure change of the substrate, which is made of silicon or the like. In view of that, the SOD material is heated at a temperature of normally 1000° C. or below, preferably 300 to 900° C. The elevation rate to the aimed temperature for hardening is normally 1 to 100° C./minute. After reaching the aimed temperature, the temperature is kept for generally 1 minute to 10 hours, preferably 15 minutes to 3 hours, to harden the material. If necessary, the hardening time or atmosphere can be changed step-by-step.

After the SOD material is converted to form an insulating layer 4, an unnecessary portion of the layer is removed. For the purpose of that, the insulating layer is polished according to the necessity, so as to remove the part formed on the flat surface of the substrate but to leave the part formed in the trenches on the substrate. Thus, the insulating layer in the part above the cap 3 is removed in this polishing treatment (FIG. 1(d)). The polishing treatment is carried out after the hardening procedure. However, if combined with the prebaking procedure, the polishing treatment can be carried out immediately after the prebaking step.

The polishing treatment is generally carried out according to CMP method. The treatment of CMP can be performed by use of normal polishing media and polishers. The polishing media are, for example, aqueous solutions in which abrasives such as silica, alumina and ceria are dispersed in combination with other additives according to the necessity. As the polishers, commercially available CMP systems can be used.

The above-described polishing treatment removes almost all the polysilazane composition-derived silicon dioxide layer in the part formed on the flat surface of the cap 3. However, in order to remove the insulating layer remaining in the part between adjacent lines of the circuit 2, the layer is further subjected to etching treatment by use of the etching solution according to the present invention. The etching treatment can be carried out in the conventional manner except for using the etching solution of the present invention.

This etching solution contains water, hydrofluoric acid, and a particular organic solvent in an amount of not more than its solubility in water. The amount of hydrofluoric acid depends on the kind of the SOD layer to be etched, but is preferably 0.06 to 2 wt %, more preferably 0.1 to 1 wt %, based on the total weight of the solution.

The particular organic solvent has a δH value, which is defined by Hansen solubility parameters as a value indicating the strength of hydrogen bond, in the range of 4 to 12 inclusive. The saturation solubility thereof in water is 5 wt % or more at 20° C. Examples of this organic solvent are as set forth in Table 1.

TABLE 1

| | δH | Saturation solubility |
|---|---|---|
| Acetoaldehyde | 7.9 | any |
| Acetone | 7.0 | any |
| Acetylacetone | 6.2 | 16.0 wt % |
| Allyl acetoacetate | 8.6 | 5.0 wt % |
| Butyric add | 10.6 | any |
| Crotonic acid | 12.0 | 9.4 wt % |
| Diethyl ether | 5.1 | 6.9 wt % |
| Diethyl ketone | 4.7 | 5.0 wt % |
| Diethyl glycol butyl ether acetate | 8.2 | 6.5 wt % |
| Diethyl glycol monobutyl ether | 10.6 | 6.5 wt % |
| Dimethoxymethane | 8.6 | 32.3 wt % |
| Dimethyl diketone | 11.7 | 20.0 wt % |
| Dimethyl ether | 5.7 | 32.8 wt % |
| Dipropylene glycol monomethyl ether acetate | 8.0 | 12.0 wt % |
| Ethyl acetate | 7.2 | 8.0 wt % |
| Ethyl acetoacetate | 8.3 | 11.6 wt % |
| Ethylene glycol dimethyl ether | 6.0 | any |
| Ethylene glycol monoethyl ether acetate | 10.6 | 23.0 wt % |
| Ethylene glycol monomethyl ether acetate | 11.6 | any |
| iso-Butyric add | 11.1 | 21.0 wt % |
| Methacrylic acid | 10.2 | 9.7 wt % |
| Methyl acetate | 7.6 | 25.0 wt % |
| Methyl acetoacetate | 8.9 | 46.0 wt % |
| Methyl ethyl ether | 6.2 | 5.0 wt % or more |
| Methyl ethyl ketone | 5.1 | 27.5 wt % |
| Methyl formate | 10.2 | 10.2 wt % |
| Methylglyoxal | 9.7 | 40.0 wt % or more |
| Glutaric acid dimethyl ester | 8.4 | 5.3 wt % |

TABLE 1-continued

|  | δH | Saturation solubility |
|---|---|---|
| 2,4-Pentanedione | 4.1 | 12.0 wt % |
| Propion aldehyde | 6.9 | 20.0 wt % |
| Propylene glycol monoethyl ether | 10.5 | any |
| Propylene glycol monoethyl ether acetate | 9.0 | 5.0 wt % or more |
| Propylene glycol monomethyl ether | 11.6 | any |
| Propylene glycol monomethyl ether acetate | 9.8 | 19.0 wt % |
| Tripropylene glycol monomethyl ether | 10.4 | any |

In the above table, "any" means that the organic solvent in the same row can mix with water in any proportion. The above organic solvents can be used in combination of two or more.

In contrast with the above solvents, solvents such as isopropyl alcohol (δH=16.4), ethyl lactate (δH=12.5) and acetic acid (δH=13.5), which are contained in conventional etching solutions, are incapable of giving the effect of the present invention because they have too large δH values.

Among the solvents shown in Table 1, those having δH values of 11.6 or less are preferred. On the other hand, the δH value is also preferably 5 or more, further preferably 7 or more. The saturation solubility in water at 20° C. is preferably 8 wt % or more, further preferably 10 wt % or more. In view of treatability and cost, preferred are propylene glycol monomethyl ether, propylene glycol monomethyl ether acetate, ethyl acetoacetate, acetone, dimethyl ether, methyl ethyl ketone and ethylene glycol dimethyl ether. Particularly preferred are propylene glycol monomethyl ether and acetone because the effect of the present invention appears remarkably when they are used.

The content of the particular organic solvent in the etching solution is generally determined so that the components can be homogeneously mixed in the solution, and hence is not especially restricted. However, the more the solution contains the solvent, the more strongly the effect of the present invention tends to appear. Because of that, the amount of the organic solvent is preferably 1 wt % or more, further preferably 5 wt % or more based on the total weight of the etching solution unless it is more than the saturation solubility of the solvent in water. If having a limited solubility in water, the organic solvent is preferably contained in as close an amount to the saturation solubility as possible. Specifically, the content of such organic solvent is preferably 80% or more, further preferably 90% or more, based on the saturation solubility thereof.

On the other hand, if the etching solution contains the organic solvent in a large amount, the etching rate tends to be lowered in the etching procedure. Accordingly, in order to ensure the etching rate, the content of the organic solvent is preferably not too large. If the organic solvent to use has a limited solubility in water, it is enough for the content thereof to be not in excess of the saturation solubility. If the organic solvent to use can be dissolved in water in any proportion, the content thereof is preferably 95 wt % or less, further preferably 90 wt % or less, based on the total weight of the etching solution.

The etching solution according to the present invention contains hydrofluoric acid and the particular organic solvent described above. If necessary, the solution further contains other components. Examples of such components include: ammonium fluoride and phosphoric acid, which are thought to assist the etching function; and surfactants, which are thought to improve wettability of the etching solution.

As the result of the etching treatment, the insulating layer 4 remaining in the part between adjacent lines of the circuit 2 is evenly removed as shown in FIG. 1(e). The etching treatment is finished at an appropriate timing, and thereby it can be possible to form a structure in which the trenches are filled with the insulator up to the level of the substrate surface. The present invention enables to remove evenly the insulating layer by etching even if widths between adjacent lines of the circuit, namely, widths of the trenches, are different from each other, as shown in FIG. 1(e).

Subsequently, the cap 3 is removed to obtain a structure in which lines of the circuit are separated by the trenches (FIG. 1(f)).

Figure 2:
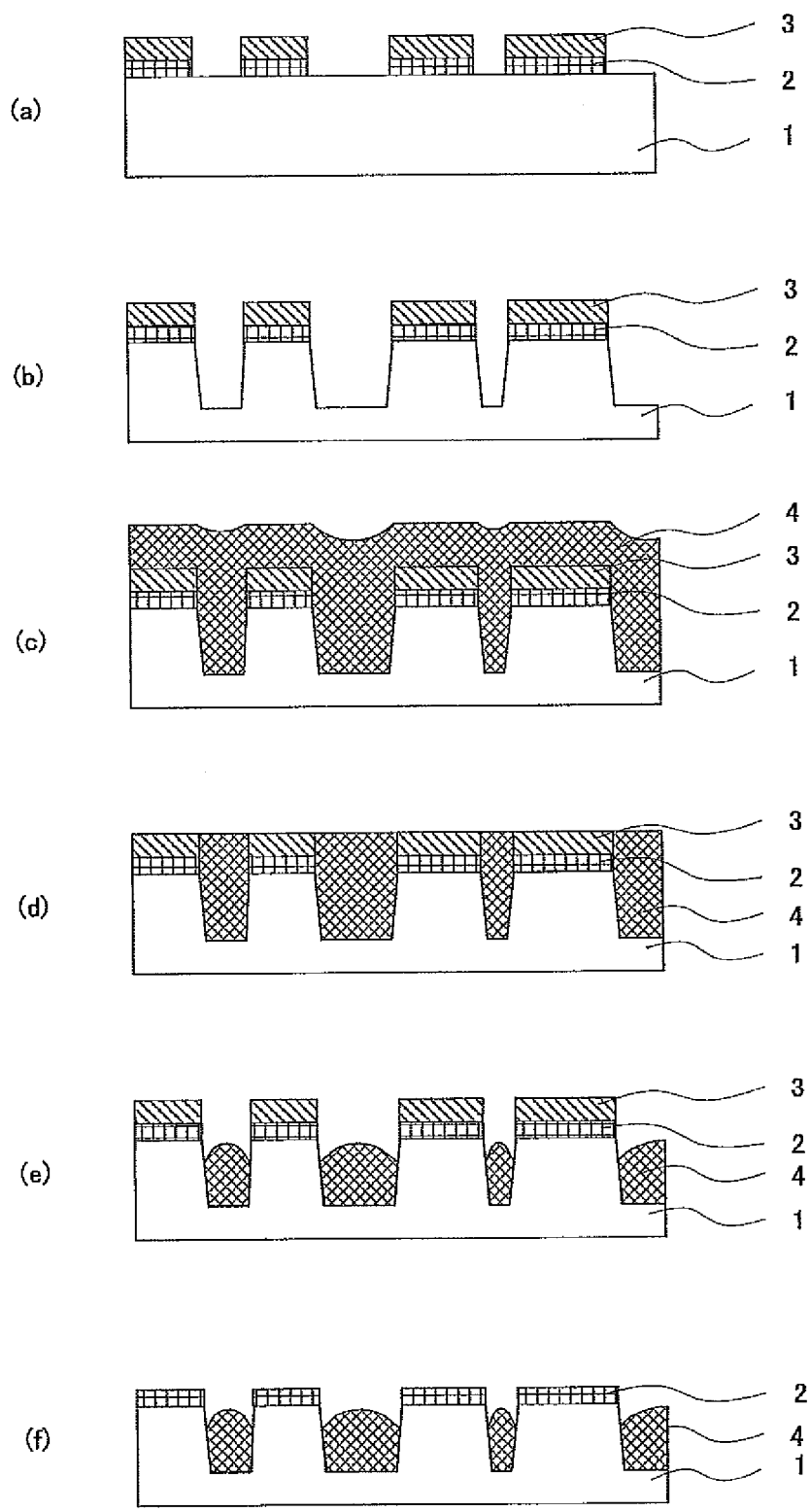
FIG. 2 shows schematic sectional views illustrating a shallow trench isolation structure-formation process employing a conventional etching solution.

An etching solution hitherto used is, for example, an aqueous hydrofluoric acid solution containing ammonium fluoride. FIG. 2 illustrates a conventional trench isolation process employing such solution. The steps of FIG. 2(a) to (d) are the same as described above. However, since the conventional etching solution is used in the wet etching procedure, the etching rate varies according to the etched point and consequently the insulator at the center of each trench is left more than that at the periphery to form a ridge as shown in FIG. 2(e). The ridges remain even if the cap 3 is removed (FIG. 2(f)). As a result, those often cause insulation failure and insufficient mechanical strength.

It is not clear why the etching solution of the present invention enables to etch the insulator evenly, but the following mechanism is presumed.

On the substrate surface, the insulating layer at the part contacting to the inner wall of each trench undergo strong tensile stress and hence tends to be readily etched. Accordingly, the etching rate in the area near the inner wall is high enough to form a ridge at the center in each trench as shown in FIG. 2(e).

Meanwhile, in an etching solution containing hydrofluoric acid, $HF_2^-$ ions are thought to contribute mainly to the etching reaction. It is presumed that too large contribution of $HF_2^-$ ions promotes the uneven etching described above. However, it is also presumed that, in the etching solution of the present invention, the particular organic solvent associates with HF to reduce ionization thereof into $HF_2^-$ ions and hence to lower the effective concentration of $HF_2^-$ ions adequately. Because of that, the etching rate in the area near the inner wall is lowered while that in the center area is not changed, so that the insulator can be evenly etched. It should be noted that this effect cannot be obtained only by reducing the concentration of hydrofluoric acid, and it is necessary to use the etching solution according to the present invention.

The etching solution of the present invention is suitable for forming the shallow trench isolation structure described above, but is also applicable to other uses. For example, the solution can be used for washing contact holes when intermetal dielectric (referred to as "IMD") layers and pre-metal dielectric (referred to as "PMD") layers are formed in the production processes of semiconductor devices. The contact holes, which have small diameters, are provided with layers on their inner walls, and the layers are often inhomogeneous in the thickness direction. Even so, the etching solution of the present invention can clean the contact holes evenly. Accordingly, in contrast with the conventional processes in which the components of etching solutions and the etching time must be so controlled as to keep the shapes of the contact holes, the etching solution of the present invention makes it unnecessary to control them.

The present invention is further explained by use of the following examples.

EXAMPLES 1 TO 19 AND COMPARATIVE EXAMPLES 1 TO 5

First, a silicon substrate having a trench structure on the surface was prepared. The structure had trenches of 80 nm, 190 nm and 1800 nm widths and the depth of them were 540 nm.

Figure 3:
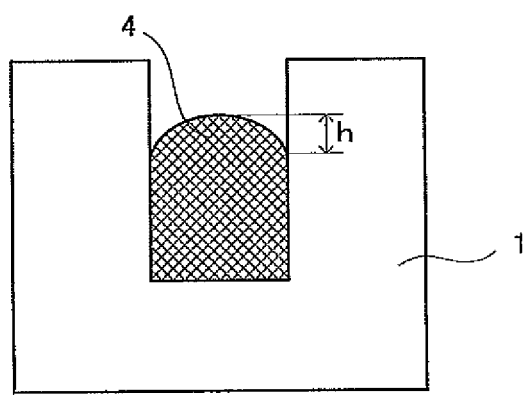
FIG. 3 is a schematic partial sectional view of a trench after subjected to etching.

The above substrate was spin-coated with a dibutyl ether solution of polysilazane (solid content: 19 wt % based on the total weight) at a rotation speed of 1000 rpm, and then the solvent was partially removed at 150° C. for 3 minutes. The polysilazane composition layer formed on the substrate surface had a thickness of 600 nm in the area other than the trenches.

ridge height in the 190 nm-width trench. Here, the "ridge height" means the level difference "h" between the parts where the SOD layer was most and least removed, as shown in FIG. 3.

The results were as set forth in Table 2.

TABLE 2

|  | HF concentration (wt. %) | Organic solvent | | | Etching rate in trenches | | | Layer in 190-nm trench | |
| --- | --- | --- | --- | --- | --- | --- | --- | --- | --- |
|  |  | compound | δH | concentration (wt. %) | 80 nm-width (A) (nm/min) | 1800 nm-width (B) (nm/min) | rate ratio A/B | ridge height (nm) | grade |
| Com. 1 | 0.98 | absent | — | — | 52.39 | 25.52 | 2.05 | 107 | C |
| Ex. 1 | 0.98 | PGMEA | 9.0 | 1 | 50.40 | 25.52 | 1.97 | 59 | B |
| Ex. 2 | 0.98 | PGMEA | 9.0 | 19 | 25.04 | 14.97 | 1.67 | 59 | B |
| Com. 2 | 0.245 | absent | — | — | 7.28 | 3.89 | 1.87 | 87 | C |
| Ex. 3 | 0.245 | PGMEA | 9.0 | 3 | 6.04 | 4.39 | 1.38 | 20 | A |
| Ex. 4 | 0.245 | PGMEA | 9.0 | 19 | 3.20 | 2.76 | 1.16 | 16 | A |
| Com. 3 | 0.98 | absent | — | — | 53.64 | 23.32 | 2.30 | 107 | C |
| Ex. 5 | 0.98 | PGME | 10.5 | 1 | 60.87 | 27.67 | 2.20 | 51 | A |
| Ex. 6 | 0.98 | PGME | 10.5 | 15 | 22.53 | 13.44 | 1.68 | 51 | A |
| Ex. 7 | 0.98 | PGME | 10.5 | 30 | 13.96 | 8.07 | 1.73 | 44 | A |
| Ex. 8 | 0.98 | PGME | 10.5 | 45 | 7.67 | 3.94 | 1.95 | 44 | A |
| Ex. 9 | 0.98 | PGME | 10.5 | 60 | 3.60 | 2.02 | 1.78 | 40 | A |
| Com. 4 | 0.245 | absent | — | — | 10.25 | 5.27 | 1.94 | 87 | C |
| Ex. 10 | 0.245 | PGME | 10.5 | 1 | 7.93 | 4.51 | 1.76 | 47 | A |
| Ex. 11 | 0.245 | PGME | 10.5 | 15 | 4.22 | 2.99 | 1.41 | 43 | A |
| Ex. 12 | 0.245 | PGME | 10.5 | 30 | 2.39 | 1.68 | 1.43 | 43 | A |
| Ex. 13 | 0.245 | PGME | 10.5 | 45 | 1.22 | 0.87 | 1.40 | 43 | A |
| Ex. 14 | 0.245 | PGME | 10.5 | 60 | 0.50 | 0.41 | 1.22 | 0 | A |
| Ex. 15 | 0.98 | EAA | 8.3 | 1 | 56.28 | 26.88 | 2.09 | 59 | B |
| Ex. 16 | 0.98 | EAA | 8.3 | 11 | 30.07 | 16.40 | 1.83 | 51 | A |
| Ex. 17 | 0.245 | EAA | 8.3 | 1 | 8.48 | 4.98 | 1.70 | 55 | A |
| Ex. 18 | 0.245 | EAA | 8.3 | 11 | 5.87 | 3.99 | 1.47 | 43 | A |
| Ex. 19 | 0.245 | Acetone | 7.0 | 15 | 5.86 | 4.22 | 1.39 | 41 | A |
| Ex. 20 | 0.245 | MEK | 5.1 | 15 | 5.11 | 3.48 | 1.47 | 47 | A |
| Ex. 21 | 0.245 | EGMEA | 10.6 | 15 | 3.94 | 3.00 | 1.31 | 28 | A |
| Ex. 22 | 0.245 | CA | 12.0 | 9 | 7.39 | 4.89 | 1.51 | 36 | A |
| Ex. 23 | 0.245 | PD | 4.1 | 10 | 5.68 | 4.08 | 1.39 | 24 | A |
| Com. 5 | 0.245 | IPA | 16.4 | 20 | 2.91 | 1.48 | 1.97 | 81 | C |

In the above table,
PGMEA stands for: propylene glycol monomethyl ether acetate,
PGME stands for: propylene glycol monomethyl ether,
EAA stands for: ethyl acetoacetate,
MEK stands for: methyl ethyl ketone,
EGMEA stands for: ethylene glycol monomethyl ether acetate,
CA stands for: crotonic acid,
PD stands for: 2,4-pentanedione, and
IPA stands for: iso-propanol.
Further, according to the ridge height, the layer in the 190 nm-width trench was graded as follows:
A (excellent): ridge height of less than 57 nm,
B (good): ridge height of 57 nm or more but less than 76 nm, and
C (poor): ridge height of 76 nm or more.

The substrate was then fired at 350° C. for 2 hours in a steam oxidation furnace (VF-1000 [trademark], manufactured by Koyo Thermo Systems Co., Ltd.) under an atmosphere of oxygen/steam mixed gas ($H_2O/(O_2+H_2O)$)=80 mol %) flowing at 8.34 L/minute, to form a layer of SOD derived from polysilazane.

Subsequently, the layer was polished by CMP to bare the substrate surface. The polished substrate was then subjected to etching treatment at 23° C. In the etching treatment, the etching time was varied to sample the substrate. The etching solution used in each example was as set forth in Table 2. After subjected to the etching treatment, the section of the substrate was observed by means of a scanning electron microscope (S-4700 [trademark], manufactured by Hitachi Ltd.), so as to measure the etching rates in the areas of the 80 nm-width and 1800 nm-width trenches and to determine the It was also found that the insulating layer could not be etched with an etching solution not containing hydrofluoric acid in each example.

BRIEF DESCRIPTION OF THE NUMERALS

1: substrate
2: circuit
3: cap
4: insulating layer

The invention claimed is:
1. A process for forming a shallow trench isolation structure, comprising the steps of:
    coating a composition containing insulating material onto a substrate surface provided with a trench structure, to form a coating layer;

firing the coated substrate to harden the insulating material, so as to form an insulating layer;

polishing the insulating layer so as to remove the part formed on the flat surface of the substrate and to leave the part formed in the trenches on the substrate and subjecting the insulating layer after polished to etching treatment by use of an etching solution containing hydrofluoric acid and an organic solvent, wherein said hydrofluoric acid is contained in an amount of 0.06 to 2 wt % based on the total weight of the solution, and wherein said organic solvent has a δH value defined by Hansen solubility parameters in the range of 4 to 12 inclusive and the saturation solubility thereof in water is 5 wt % or more at 20° C. and wherein said insulating material is a polysilazane compound and said insulating layer is a siliceous film and further wherein the etching solution removes evenly the insulating layer by etching where the widths of the trenches are different from each other.

2. The process according to claim 1 for forming a shallow trench isolation structure, which further comprises the step of polishing the insulating layer formed on the substrate after the step of firing.

3. The process according to claim 2 for forming a shallow trench isolation structure, wherein the step of polishing is carried out according to chemical mechanical polishing.

4. The process according to claim 1 for forming a shallow trench isolation structure, wherein the etching solution containing hydrofluoric acid comprises 0.1 to 1 wt % hydrofluoric acid.

5. The process according to claim 1 for forming a shallow trench isolation structure, wherein the organic solvent is chosen from the group consisting of acetoaldehyde, acetone, acetylacetone, allyl acetoacetate, butyric acid, crotonic acid, diethyl ether, diethyl ketone, diethyl glycol butyl ether acetate, diethyl glycol monobutyl ether, dimethoxymethane, dimethyl diketone, dimethyl ether, dipropylene glycol monomethyl ether acetate, ethyl acetate, ethyl acetoacetate, ethylene glycol dimethyl ether, ethylene glycol monoethyl ether acetate, ethylene glycol monomethyl ether acetate, isobutyric acid, methacrylic acid, methyl acetate, methyl acetoacetate, methyl ethyl ether, methyl ethyl ketone, methyl formate, methylglyoxal, glutaric acid dimethyl ester, 2,4-pentanedione, propionaldehyde, propylene glycol monoethyl ether, propylene glycol monoethyl ether acetate, propylene glycol monomethyl ether, propylene glycol monomethyl ether acetate and tripropylene glycol monomethyl ether.

6. The process according to claim 1 for forming a shallow trench isolation structure, wherein the organic solvent is chosen from the group consisting of acetone, crotonic acid, ethyl acetoacetate, ethylene glycol monomethyl ether acetate, methyl ethyl ketone, 2,4-pentanedione, propylene glycol monomethyl ether, and propylene glycol monomethyl ether acetate.

7. The process according to claim 1 for forming a shallow trench isolation structure wherein firing the coated substrate to harden the insulating material, so as to form an insulating layer is done at a temperature between 300 to 900° C. for 15 minutes to 3 hours.

8. The process according to claim 1 for forming a shallow trench isolation structure wherein firing the coated substrate to harden the insulating material, so as to form an insulating layer is done in steam containing oxygen or an inert gas.

9. The process according to claim 1 for forming a shallow trench isolation structure wherein firing the coated substrate to harden the insulating material, so as to form an insulating layer is done in steam containing oxygen or an inert gas wherein the concentration of steam is higher than 1 wt %.

10. The process according to claim 1 for forming a shallow trench isolation structure wherein firing the coated substrate to harden the insulating material, so as to form an insulating layer is done in steam containing oxygen or an inert gas wherein the concentration of steam is higher than 10 wt %.

11. The process according to claim 1 for forming a shallow trench isolation structure wherein firing the coated substrate to harden the insulating material, so as to form an insulating layer is done in steam containing oxygen or an inert gas wherein the concentration of steam is higher than 20 wt %.

12. The process according to claim 1 for forming a shallow trench isolation structure wherein firing the coated substrate to harden the insulating material, so as to form an insulating layer wherein the coating layer has a thickness of 20 to 150 nm.

13. The process according to claim 1 for forming a shallow trench isolation structure wherein firing the coated substrate to harden the insulating material, so as to form an insulating layer wherein the coating layer has a thickness of 30 to 100 nm.

* * * * *